United States Patent [19]
Sung

[11] Patent Number: 6,093,627
[45] Date of Patent: Jul. 25, 2000

[54] SELF-ALIGNED CONTACT PROCESS USING SILICON SPACERS

[75] Inventor: Kuo-Tung Sung, Hsinchu, Taiwan

[73] Assignee: Mosel Vitelic, Inc., Hsinchu, Taiwan

[21] Appl. No.: 09/075,790

[22] Filed: May 12, 1998

[30] Foreign Application Priority Data

Mar. 27, 1998 [TW] Taiwan ................................. 87104608

[51] Int. Cl.⁷ .............................................. H01L 21/3205
[52] U.S. Cl. ........................... 438/586; 438/597; 438/947
[58] Field of Search ..................................... 438/585, 586, 438/597, 947

[56] References Cited

U.S. PATENT DOCUMENTS

| | | | |
|---|---|---|---|
| 5,338,952 | 8/1994 | Yamauchi | 257/315 |
| 5,547,885 | 8/1996 | Ogoh | 438/585 |
| 5,834,360 | 10/1998 | Tesauro et al. | 438/455 |

*Primary Examiner*—John F. Niebling
*Assistant Examiner*—John Murphy
*Attorney, Agent, or Firm*—Bacon & Thomas

[57] ABSTRACT

A method of forming self-aligned contact by using silicon spacers is provided. The process comprising: forming gate structures on a semiconductor substrate, the gate structure comprising a layer of gate oxide, at least one layer of conducting material and a layer of etching stop material; forming an overall conformal layer of first dielectric material, then etching back the first dielectric layer to form first side wall spacers on both sides of the gate structure; forming an overall conformal layer of etching selectivity material, then etching back the etching selectivity layer by second etching to form second side wall spacers overlying the first side wall spacers, the second side wall spacers providing an effective protecting layer over the gate structure in the successive etching process; forming and planarizing a second dielectric layer overall; forming an opening in the second dielectric layer by etching through the second side wall spacers down to said semiconductor substrate to form a self-aligned contact via, the contact via is self-aligned in the region between the second side wall spacers of two adjacent gate structures by the advantage of high etching selectivity between the second side wall spacers and the second dielectric layer; thermal oxidizing exposed second side wall spacers to form a thin first oxide layer, the first oxide layer providing an electrical isolating layer between the conducting material in contact via and the second side wall spacers.

19 Claims, 3 Drawing Sheets

SELF-ALIGNED CONTACT PROCESS USING SILICON SPACERS

BACKGROUND OF THE INVENTION (1) Field of the Invention

The invention relates to a self-aligned contact process and more particularly to a contact etching process of high etching selectivity by using silicon spacers.

(2) Description of the Prior Art

As semiconductor devices continually progress towards denser packing of active devices, the alignment between the mask and the device becomes an extremely important issue. Owing to the limitation of the photo lithographic process, misalignment in the masking process is unavoidable. Although the misalignment can be compensated by enlarging misalignment tolerance in circuit designing, however the increase of device dimension makes it less favorable in the trend of high packing density. In order to solve the problem of misalignment in the masking process and to further minimize the device size, a contact etching process known as self-alignment contact (SAC) process is surfaced over the past few years.

A typical self-aligned contact, as shown in FIG. 1, would be formed by a process, comprising: receiving a semiconductor substrate 10 having gate structures formed thereon, the gate structure comprising a layer of gate oxide 11 and at least a layer of conducting material 12; depositing an overall conformal layer of silicon nitride, then anisotropically etching back the silicon nitride layer to form side wall spacers 13 on both sides of the gate structure; thereafter, providing and planarizing an overall inter layer dielectric 14, the inter layer dielectric 14 is then anisotropically etched to form the self-aligned contact with the aid of a patterned mask. During the contact etching process the gate structure is protected by the side wall spacers 13, thus the etching process is confined to the region between the side wall spacers 13 to form the self-aligned contact window.

The side wall spacers protect the gate structure from undercutting in the contact etching process when misalignment occurred in the masking process. However, due to low etching selectivity between the side wall spacers and the inter layer dielectric, a great part of the side wall spacers is consumed in the contact etching process. The damage of side wall spacers usually leads to a short circuit in the metallization process and much effort has been directed to modify the fabrication process, especially on the etching process, to make the self-aligned contact process more reliable.

SUMMARY OF THE INVENTION

The present invention seeks to provide a method of increasing the etching selectivity in the self-aligned contact process by forming a high etching-selectivity layer on the side wall spacers to avoid the etching problem mentioned above. The high etching-selectivity layer is provided by forming a layer of undoped polysilicon or undoped amorphous silicon over the conventional side wall spacers.

According to the present invention, there is provided a method of forming a self-aligned contact, comprising: providing a semiconductor substrate having gate structures formed thereon, the gate structure comprising a layer of gate oxide, at least one layer of conducting material and a layer of etching stop material, the etching stop layer providing, on the top of gate structure, an etching stop in the patterning process of the gate structure and in the succeeding etching process; then, forming an overall conformal layer of first dielectric material; thereafter, anisotropically etching back the first dielectric layer to form first side wall spacers on both sides of the gate structure; then, forming an overall conformal layer of etching selectivity material; thereafter, anisotropically etching back the etching selectivity layer to form second side wall spacers overlying the first side wall spacers, the second side wall spacers having a high etching selectivity to lately formed inter layer dielectric, thereby providing an effective protecting layer over the gate structure; forming and planarizing a second dielectric layer, the third dielectric layer serving as an inter layer dielectric in the integrated circuit; forming an opening in the second dielectric layer by etching through the second side wall spacers down to the semiconductor substrate to form the self-aligned via, the contact etching process is self-aligned in the region between the gate structures by the advantage of high etching selectivity between the second side wall spacers and the second dielectric layer; thermal oxidizing the exposed second side wall spacers to form a thin first oxide layer, the first oxide layer providing an electrical isolating layer between the contact plug and the second side wall spacers.

Consequently, self-aligned contact structures may be formed by using silicon spacers.

BRIEF DESCRIPTION OF THE DRAWINGS

A preferred embodiment of the invention will now be described by way of example, with reference to the accompanying drawings, in which.

DESCRIPTION OF THE PREFERRED EMBODIMENT

The present invention is directed to a process of forming the self-aligned contact by using silicon spacers. Description of the steps, as shown in FIGS. 2–7, will now follow.

Figure 1:
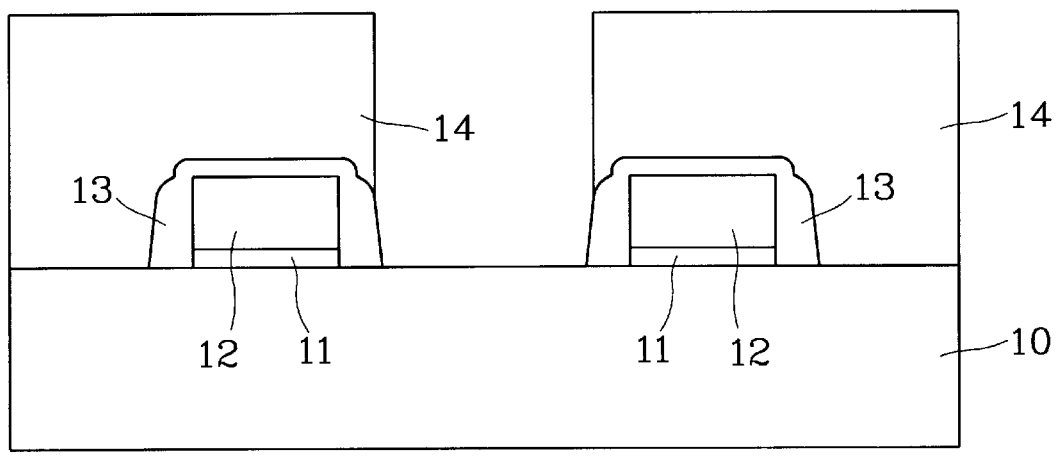
FIG. 1 shows the cross sectional view illustrative of a self-aligned contact formed by conventional method.
Figure 2:
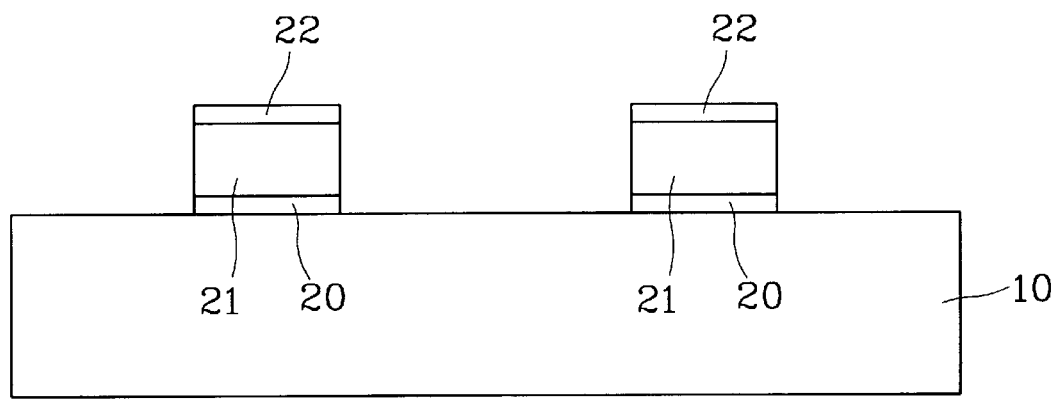
FIG. 2 shows a cross sectional view of an in-process wafer portion having gate structures formed on a semiconductor substrate, the gate structure comprising a layer of gate oxide, at least one layer of conducting material and a layer dielectric of etching stop material.

As shown in FIG. 2, a semiconductor substrate is provided in the form of P type, <100> Si substrate 10. The semiconductor substrate is provided with patterned gate structures comprising a layer of gate oxide 20, at least one layer of conducting material 21 overlying the gate oxide 20 and a layer of etching stop material 22 overlying the conducting layer 21 by using conventional process steps, known to one skilled in the art. The etching stop layer provides, on the top of gate structure, an etching stop in the patterning process of the gate structure and in the succeeding etching process.

Preferably, the material of gate oxide is silicon oxide which is formed by thermal oxidation and has a thickness in the range around 40 Å~150 Å. The conducting material can be polysilicon or polysilicide. The etching stop material can be silicon nitride or silicon oxide both of which can be formed by chemical vapor deposition. If the etching stop material is silicon nitride, the thickness of the etching stop material is in the range around 1000 Å~3000 Å.

Figure 3:
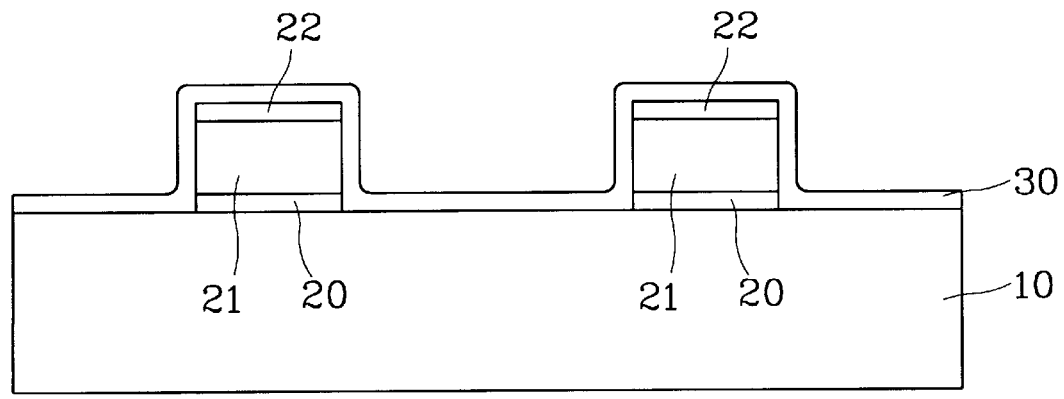
FIG. 3 shows a cross sectional view of an in-process wafer portion of FIG. 2 after proving a conformal layer of first dielectric material overall.

Referring now to FIG. 3, a conformal layer of first dielectric material 30 is deposited overall. The first dielectric layer 30 can be silicon nitride which can be formed by chemical vapor deposition and have a thickness in the range around 100 Å~1000 Å. Also, a thin oxide layer, approximately 100 Å thick, can be formed underneath the nitride layer to reduce stress.

Figure 4:
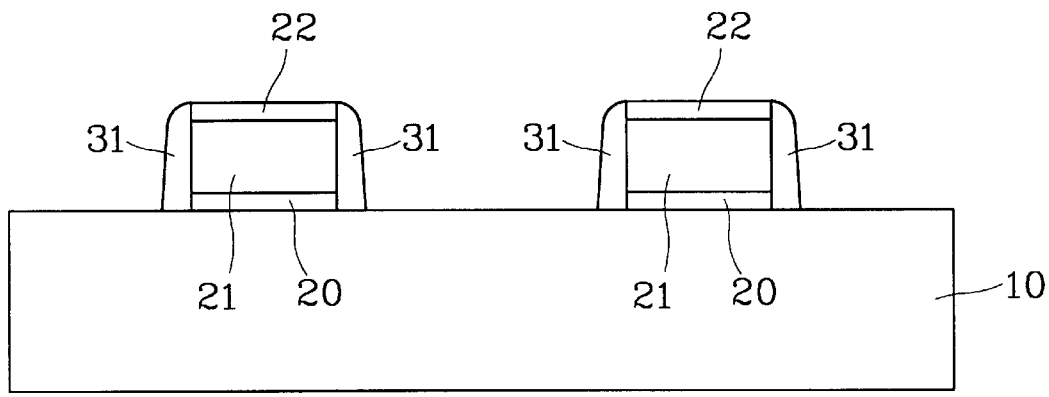
FIG. 4 shows a cross sectional view of an in-process wafer portion of FIG. 3 after anisotropically etching the first dielectric layer to form the first side wall spacers on both sides of the gate structure.

Referring now to FIG. 4, the first dielectric layer is anisotropically etched by plasma etching to form first side wall spacers 31 on both sides of the gate structure.

Figure 5:
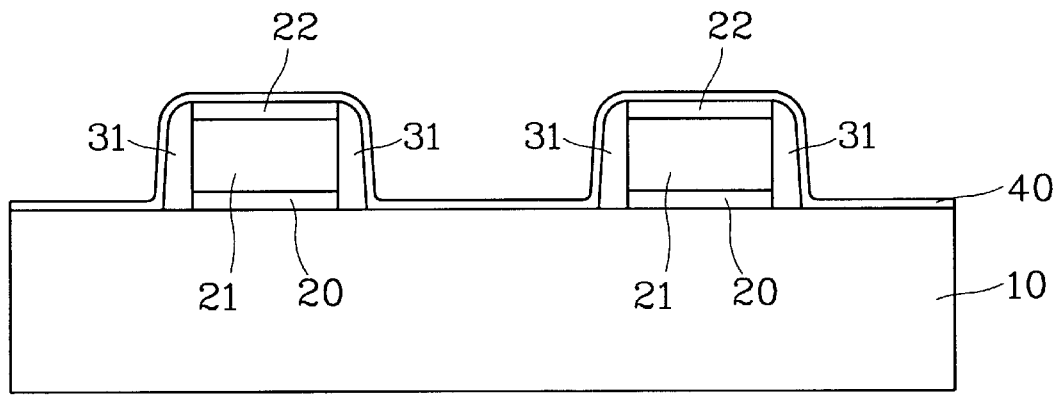
FIG. 5 shows a cross sectional view of an in-process wafer portion of FIG. 4 after providing a conformal layer of etching selectivity material overall.

Referring now to FIG. 5, a conformal layer of etching selectivity material 40 is deposited overall. The material of etching-selectivity layer 40 is chosen for the effect of maximum etching selectivity, thus varies with the succeeding etching process. Typically, the etching selectivity material can be undoped polysilicon or undoped amorphous silicon both of which can be formed by chemical vapor deposition. The thickness of etching selectivity layer is the thinner the better to increase the resistivity of etching selectivity layer to avoid the current leakage. In general, the thickness of the etching selectivity layer is in the range around 100 Å~1000 Å and a best result is obtained in the range around 100 Å~200 Å in the preferred embodiment of present invention.

Figure 6:
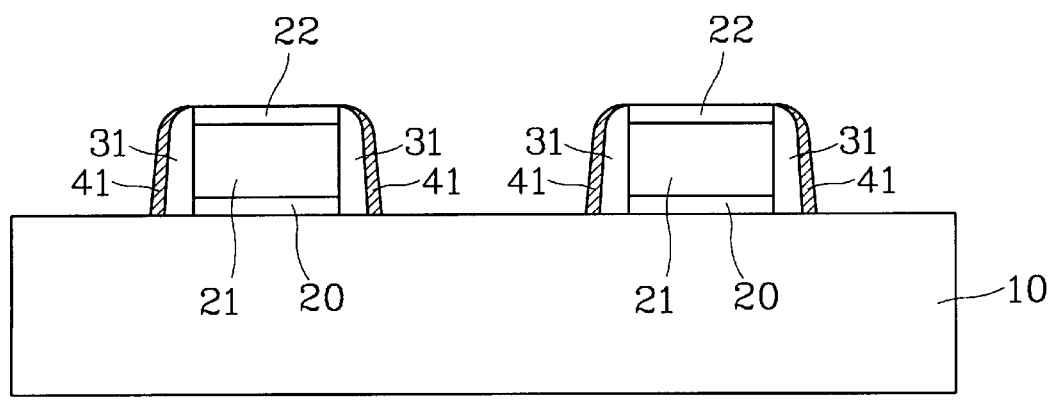
FIG. 6 shows a cross sectional view of an in-process wafer portion of FIG. 5 after anisotropically etching the etching-selectivity layer to form the second side wall spacers overlying the first side wall spacers.

Referring now to FIG. 6, the etching selectivity layer is anisotropically etched back by plasma etching to form second side wall spacers overlying the first side wall spacers. The second side wall spacers provide a high etching selectivity to lately formed inter layer dielectric, thus form an effective protecting layer on first side wall spacers in the succeeding contact etching process.

Figure 7:
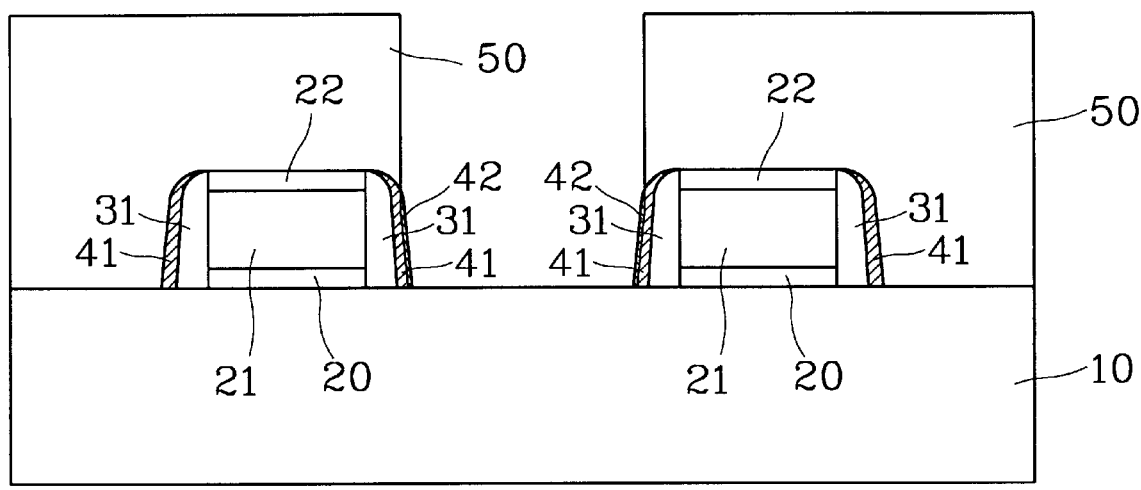
FIG. 7 shows a cross sectional view of an in-process wafer portion of FIG. 6 after providing and planarizing a conformal layer of second dielectric material overall, then forming the self-aligned via with the aid of a patterned mask and subsequently thermal oxidizing the exposed portions of the second side wall spacers.

Referring now to FIG. 7, a second dielectric layer 50 acting as an inter layer dielectric (ILD) is deposited overall and then is planarized by conventional known planarization method, such as block resist and resist etch back or chemical mechanical polishing. Preferably, the second dielectric layer 50 is silicon oxide which is formed by chemical vapor deposition and has a thickness in the range around 4000 Å~15000 Å.

Subsequently, portions of the third dielectric layer 50 is anisotropically and selectively etched through the opening of a patterned mask to form the self-aligned via. Typically, the contact etching process is done by plasma etching and is self-aligned in the region between the second side wall spacers of two adjacent gate structures by the advantage of high etching selectivity between the second side wall spacers and the second dielectric layer.

At last, the exposed second side wall spacers 41 is thermal oxidized to form a thin first oxide layer 42. The first oxide layer 42 provides an electrical isolating layer and avoids the short-circuit between the contact plug and the second side wall spacers 41. Typically, the first oxide layer 42 is formed by thermal oxidation in the temperature range around 800° C.~900° C.

During the formation of first oxide layer 42, the exposed portions of silicon substrate in the contact via is also thermal oxidized, thus a precleaning process is needed prior to the metallization process to remove the oxide layer on silicon substrate.

Although the present invention has been described with reference to a preferred embodiment, it should be appreciated that various modifications and adaptations can be made without departing from the scope of the invention as defined in the claims.

I claim:

1. A process for forming self-aligned contact on a semiconductor substrate by using silicon spacers, said process comprising:

a) forming gate structures on said semiconductor substrate, said gate structures comprising a layer of gate oxide, at least one layer of conducting material and a layer of etching stop material, said etching stop material providing, on the top of said structures, gate an etching stop in the patterning process of said gate structures and in a succeeding etching process;

b) forming an overall conformal layer of first dielectric material on said gate structures;

c) anisotropically etching back said first dielectric layer by a first etching method to form first side wall spacers on both sides of said gate structures;

d) forming an overall conformal layer of etching-selectivity material;

e) anisotropically etching back said etching-selectivity layer by a second etching method to form second side wall spacers overlying said first side wall spacers, said second side wall spacers providing an effective protecting layer over said gate structures in a successive etching process;

f) forming and planarizing an overall second dielectric layer;

g) forming an opening in said second dielectric layer by a third etching method to remove portions of said second dielectric layer through said second side wall spacers down to said semiconductor substrate to form a self-aligned contact via, wherein said contact via is self-aligned in the region between said second side wall spacers on two adjacent said gate structures by the advantage of high etching selectivity between said second side wall spacers and said second dielectric layer;

h) thermally oxidizing exposed second side wall spacers to form a thin first oxide layer, said first oxide layer providing an electrically isolating layer between the conducting material in said contact via and said second side wall spacers.

2. The process as recited in claim 1, wherein said etching stop material is silicon nitride.

3. The process as recited in claim 2, wherein said silicon nitride has a thickness in the range around 1000 Å~3000 Å.

4. The process as recited in claim 1, wherein said first dielectric material is silicon nitride.

5. The process as recited in claim 4, wherein said silicon nitride has a thickness in the range around 100 Å~1000 Å.

6. The process as recited in claim 1, wherein underneath said first dielectric layer further comprising a stress relief layer.

7. The process as recited in claim 6, wherein said stress relief layer is silicon oxide and has a thickness around 100 Å.

8. The process as recited in claim 1, wherein said first etching method is anisotropical dry etching.

9. The process as recited in claim 1, wherein said etching selectivity material is undoped polysilicon.

10. The process as recited in claim 9, wherein said undoped polysilicon has a thickness in the range around 100 Å~1000 Å.

11. The process as recited in claim 1, wherein said etching selectivity material is undoped amorphous silicon.

12. The process as recited in claim 11, wherein said undoped amorphous silicon has a thickness in the range around 100 Å~1000 Å.

13. The process as recited in claim 1, wherein said second etching method is anisotropical dry etching.

14. The process as recited in claim 1, wherein said second dielectric material is silicon oxide.

15. The process as recited in claim 1, wherein said second dielectric material has a thickness in the range around 4000 Å~15000 Å.

16. The process as recited in claim 1, wherein said second dielectric layer is planarized by block resist and resist etch back.

17. The process as recited in claim 1, wherein said second dielectric layer is planarized by chemical mechanical polishing.

18. The process as recited in claim 1, wherein said third etching method is anisotropical dry etching.

19. The process as recited in claim 1, wherein said first oxide layer is formed by thermal oxidation in the temperature range around 800° C.~900° C.

* * * * *